United States Patent
Fujii

[11] Patent Number: 5,548,720
[45] Date of Patent: Aug. 20, 1996

[54] FAULT SUPERVISION METHOD FOR TRANSMISSION APPARATUS

[75] Inventor: Yasuo Fujii, Kawasaki, Japan

[73] Assignee: Fujitsu Limited, Kanagawa, Japan

[21] Appl. No.: 182,189
[22] PCT Filed: May 18, 1993
[86] PCT No.: PCT/JP93/00649
  § 371 Date: Jan. 19, 1994
  § 102(e) Date: Jan. 19, 1994
[87] PCT Pub. No.: WO93/23808
  PCT Pub. Date: Nov. 25, 1993

[30] Foreign Application Priority Data

May 19, 1992 [JP] Japan ............................ 4-125177

[51] Int. Cl.$^6$ ............................ G06F 11/34; G06F 15/40
[52] U.S. Cl. ............................ 395/184.01; 371/68.2
[58] Field of Search ............................ 371/8.2, 7, 11.2, 371/20.1, 20.4, 20.5, 20.6, 67.1, 68.1, 68.2; 395/575, 181, 182.13, 182.16, 182.18, 182.19, 184.01, 183.01

[56] References Cited

U.S. PATENT DOCUMENTS 3,839,707 10/1974 Woodward et al. .
4,704,714 11/1987 Tomizawa et al. ............ 370/15
5,206,860 4/1993 Brown et al. ............ 371/20.1
5,237,677 8/1993 Hirosawa et al. ............ 371/16.5
5,280,515 1/1994 Nagatsu ............ 395/183.01
5,347,646 9/1994 Hirosawa et al. ............ 395/183.01

FOREIGN PATENT DOCUMENTS 122149 7/1984 Japan ............ H04L 11/08
108642 5/1987 Japan ............ H04L 13/00
63-35040 2/1988 Japan ............ H04L 11/00

*Primary Examiner*—Robert W. Beausoliel, Jr.
*Assistant Examiner*—Albert Decady

[57] ABSTRACT

A fault supervision method for notifying a change in a fault/recovery state of a transmission apparatus, based on fault supervision result data indicating a plurality of fault supervision items set in a memory, includes alternately setting the fault supervision result data at an arbitrary point in time and the fault supervision result data at a next point in time from the memory into a first collection buffer and a second collection buffer, setting present fault supervision result data into a double guard buffer only when the previous and present fault supervision result data set in the first and second collection buffers match for all fault supervision items, and setting data indicating the fault supervision items for which the fault/recovery state changed into a transition point buffer based on the data set in the double guard buffer.

12 Claims, 7 Drawing Sheets (A) EXAMPLE OF STORAGE REGIONS OF EACH BUFFER (B) EXAMPLE OF USE OF FAULT SUPERVISION BIT (A) EXAMPLE OF STORAGE REGIONS OF EACH BUFFER (B) EXAMPLE OF USE OF FAULT SUPERVISION BIT

5,548,720

FAULT SUPERVISION METHOD FOR TRANSMISSION APPARATUS

TECHNICAL FIELD

The present invention generally relates to fault supervision methods for transmission apparatuses, and more particularly to a fault supervision method for a transmission apparatus that uses software to supervise faults in units of the transmission apparatus and line faults.

BACKGROUND ART

Fault supervision functions of the transmission apparatus include a process of periodically inspecting various faults of the transmission apparatus, managing fault generation and changes in recovery states, notifying the fault generation and the recovery and the like. When a unit fault or a line fault is detected by a hardware of the transmission apparatus, an input/output (I/O) map is formed in the I/O memory based on data output from the hardware. This I/O map indicates the fault/recovery state in real-time. A software of the transmission apparatus notifies the fault generation at each supervision point based on the I/O map to a maintenance person by turning ON a light emitting element or the like, or to a host apparatus. In addition, the software of the transmission apparatus also notifies state change information related to the fault/recovery state.

The notification of the state change information related to the fault/recovery state is carried out by a method called a change of status (COS) process which detects whether or not the same supervision state continues and detects the change related to the fault generation.

However, recently, the number of supervision items has increased considerably in order to realize an improved service of a fault supervision system of the transmission apparatus, and the tendency is that there are varieties of related processes. For this reason, it is becoming necessary to carry out a large number of complex processes within a short time, and there are increasing demands to realize a high-speed fault supervision process.

DISCLOSURE OF THE INVENTION

Accordingly, it is a general object of the present invention to provide a novel and useful fault supervision method for transmission apparatus, in which the demands described above are satisfied.

Another and more specific object of the present invention is to provide a fault supervision method for transmission apparatus, notifying a change in a fault/recovery state based on fault supervision result data related to a plurality of fault supervision items set in a memory, comprising the steps of (a) alternately setting the fault supervision result data at an arbitrary point in time and the fault supervision result data at a next point in time from the memory (10) into a first collection buffer and a second collection buffer, (b) setting present fault supervision result data into a double guard buffer only when the previous and present fault supervision result data set in the first and second collection buffers match for all fault supervision items, and (c) setting data indicating the fault supervision items for which the fault/recovery state changed into a transition point buffer based on the data set in the double guard buffer. According to the present invention, it is possible to prevent detection or the like of a fault which is instantaneously generated when the unit of the transmission apparatus is switched, because the double guard process is carried out.

Still another object of the present invention is to provide the fault supervision method for transmission apparatus described above, which further comprises the step of (d) setting a flag when the previous and present fault supervision result data set in the first and second collection buffers differ for at least one supervision item and otherwise clearing the flag, and omitting at least said step (c) when the flag is cleared for two successive points in time. According to the present invention, it is possible to greatly reduce the supervision process time by carrying out the flag discrimination process in a normal state where the change of the fault generation/recovery does not occur. When the flag discrimination process is carried out, it is possible to shorten the supervision interval, quicken the fault detection timing, and positively carry out the required process within 1 cycle of the fault supervision function even when the number of supervision points (supervision items) increase, thereby improving the service of the fault supervision system of the transmission apparatus.

Other objects and further features of the present invention will be apparent from the following detailed description when read in conjunction with the accompanying drawings.

BEST MODE OF CARRYING OUT THE INVENTION

Figure 1:
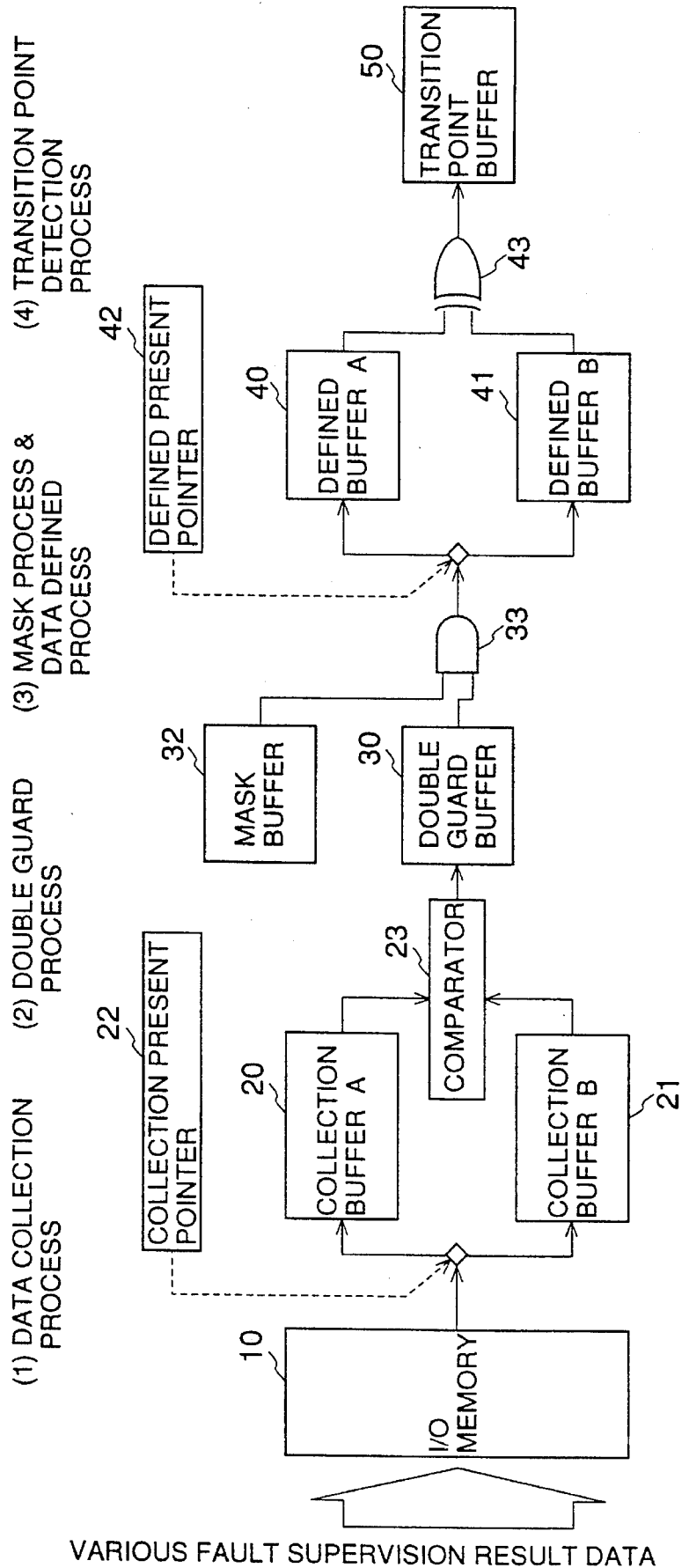
FIG. 1 is a diagram showing a data flow in a first embodiment of a fault supervision method for transmission apparatus according to the present invention.
Figure 2:
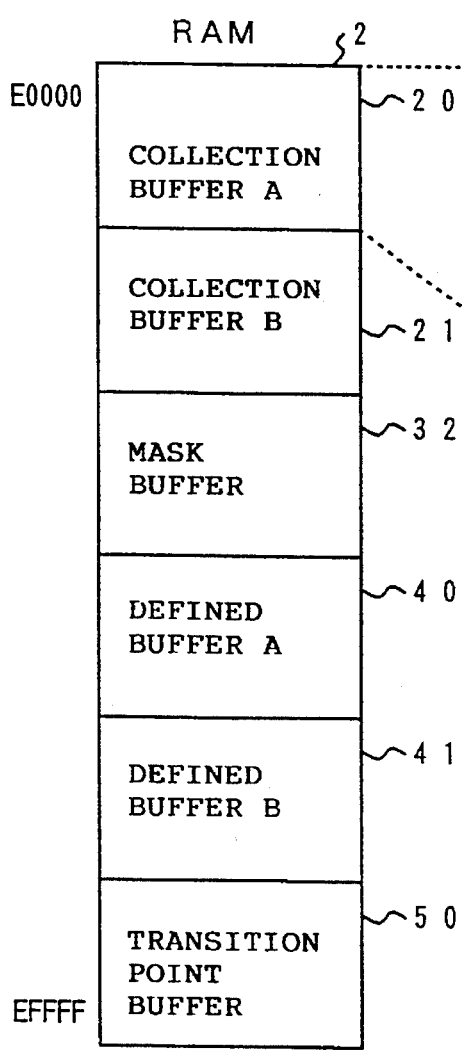
FIG. 2 is a diagram showing an example of setting a storage region of each buffer in a memory and an example of using fault supervision bits in the first embodiment.
Figure 3:
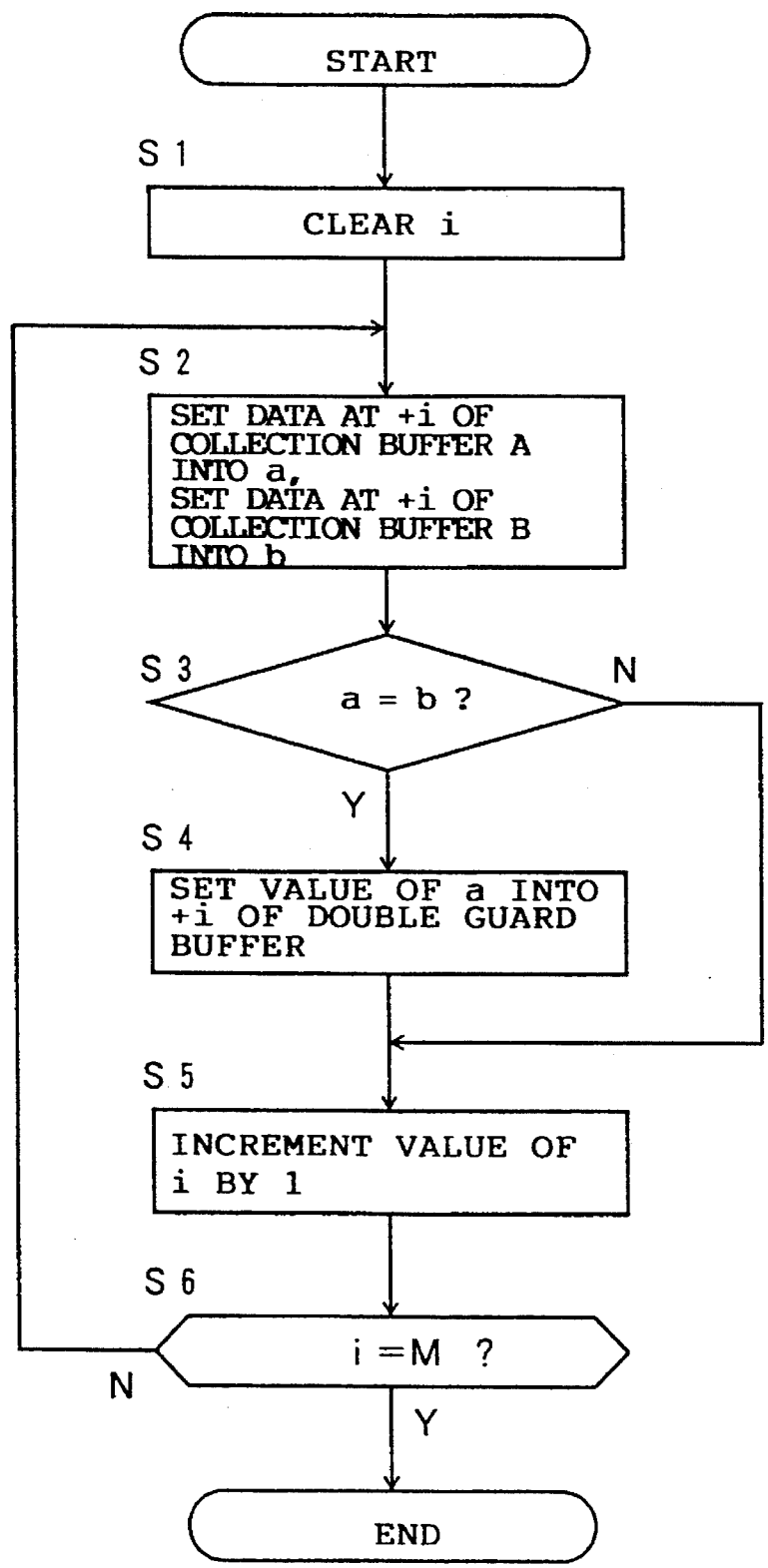
FIG. 3 is a flow chart showing a double guard process of the first embodiment.

First, a description will be given of a first embodiment of a fault supervision method for transmission apparatus according to the present invention, by referring to FIGS. 1 through 3. FIG. 1 shows a data flow in the first embodiment, and FIG. 2 shows an example of setting a storage region of each buffer in a memory shown in FIG. 1 and an example of using fault supervision bits. In addition, FIG. 3 shows a double guard process in FIG. 1.

In FIG. 1, fault supervision result data related to a fault detected by a hardware of a transmission apparatus are periodically input to an I/O memory 10. Blocks other than the I/O memory 10 are functional blocks which functionally show software processes carried out by a central processing unit (CPU, not shown) of the transmission apparatus. These functional blocks include collection buffers 20 and 21, a collection present pointer 22, a comparator 23, a double guard buffer 30, a mask buffer 32, an AND circuit 33, defined buffers 40 and 41, a defined present pointer 42, an exclusive-OR (hereinafter referred to as EX-OR) circuit 43, and a transition point buffer 50. The collection buffers 20 and 21, the mask buffer 32, the defined buffers 40 and 41, and the transition point buffer 50 respectively correspond to memory regions of a random access memory (RAM) 2.

The hardware of the transmission apparatus supervises the unit fault of the transmission apparatus, the line fault and the like in real-time at 5000 to 6000 supervision points, for example. Accordingly, the fault supervision result data having a bit "1" for fault and a bit "0" for normal are written into predetermined addresses of the I/O memory 10 in real-time as data in bit units.

Next, a description will be given of (1) a data collection process, (2) a double guard process, (3) a mask process and a data defined process, and (4) a transition point detection process shown in the upper portion of FIG. 1 in this order.

A fault supervision function of the transmission apparatus cyclically carries out the above processes (1) through (4) for every 0.5 second, for example.

(1) Data Collection Process:

First, the fault supervision result data (hereinafter simply referred to as data) written in the I/O memory 10 which are in byte units and related to the plurality of fault supervision points, are alternately written (copied) into the collection buffers 20 and 21 which form a buffer having two sides, namely, A and B. An operation of writing the present several kilo-bytes of data related to 5000 to 6000 supervision points, for example, into the collection buffer 20 in one operation, and an operation of writing several kilo-bytes of data at the next point in time into the collection buffer 21 in one operation, are alternately carried out for every 0.5 second, for example. The collection present pointer 22 manages a destination where the data are to be supplied, and alternately switches the input of the collection buffers 20 and 21.

The fault at each supervision point is described in bit units in a memory region which is continuously or discretely defined in the I/O memory 10, and a bit "1" indicates a fault and a bit "0" indicates a normal operation (in recovery). Accordingly, the data "1" or "0" are alternately written into the collection buffers 20 and 21 shown in FIG. 2 (A) as shown in FIG. 2 (B). In the example shown in FIG. 2 (B), out of the data first written into the collection buffer 20, the first 1 byte is "00000001" and the next 1 byte is "00010000". In addition, out of the data next written into the collection buffer 21, the first 1 byte is "00001001" and the next 1 byte is "00010000". Out of the data written into the collection buffers 20 and 21, "0" indicates a normal state of the supervision point, and "1" indicates an abnormal state of the supervision point. Moreover, each bit of the first byte in the collection buffer 20 and each corresponding bit of the first byte in the collection buffer 21 indicate the state of the same supervision point at different points in time.

Accordingly, in the example shown in FIG. 2 (B), the fifth bit of the first byte in the collection buffer 20 is "0", but at the next point in time, the fifth bit of the first byte in the collection buffer 21 indicating the same supervision point is "1", thereby indicating that a fault was generated at this supervision point. In addition, since the eighth bit of the first byte and the fourth bit of the second byte are both "1" in the collection buffers 20 and 21, it is indicated that the fault continues to exist at these supervision points.

(2) Double Guard Process:

The present data related to 5000 to 6000 supervision points, for example, are written in the collection buffer 20, and the data related to the same 5000 to 6000 supervision points at a time 0.5 second before are written in the collection buffer 21, by the process (1) described above. The comparator 23 compares the present data which are related to each of the supervision points and are within the collection buffer 20 with the corresponding data of 0.5 second before within the collection buffer 21, and writes the present datum into the double guard buffer 30 only when the two compared corresponding data match. On the other hand, when the two compared corresponding data do not match, the corresponding datum within the double guard buffer 30 is the datum of at least 0.5 second before which was written into the double guard buffer 30 via the comparator 23. Such a process is carried out for each of the supervision points, that is, for the data written in the collection buffers 20 and 21.

By this double guard process, the data indicating the fault generation or the data indicating the fault recovery are written into the double guard buffer 30 only when the fault is continuously generated two times or the generated fault is continuously recovered two times. Thus, it is possible to prevent detection of a fault which is instantaneously generated and detection of an instantaneous fault recovery when the unit of the transmission apparatus is switched.

The flow chart of FIG. 3 shows the series of operations which write and set in the double guard buffer 30 the data which are written and set in the collection buffers 20 and 21. In FIG. 3, a step S1 clears an address counter value i of the double guard buffer 30. A step S2 sets the data written in the collection buffers 20 and 21, which are in byte units and are related to 5000 to 6000 supervision points, for example, into buffers a and b of the RAM 2 in order in byte units. More particularly, the data at an address "address+i" of the collection buffer 20 are set in the buffer a, and the data at an address "address+i" of the collection buffer 21 are set in the buffer b.

A step S3 compares the data within the buffers a and b one datum (1 bit) at a time, and decides whether or not the two compared data match. In this embodiment, the comparison is repeated 5000 to 6000 times because the data related to 5000 to 6000 supervision points are set. At each comparison, if the two compared data match and the decision result in the step S3 is YES, the process advances to a step S4. On the other hand, if the two compared data do not match and the decision result in the step S3 is NO, the process advances to a step S5. The step S4 sets the data in the buffer a at the address "address+i" of the double guard buffer 30.

The step S5 increments the value of the address counter value i of the double guard buffer 30. In addition, a step S6 decides whether or not the value indicated by the address counter value i of the double guard buffer 30 is equal to a maximum value M of the storage capacity of each of the collection buffers 20 and 21, and the process returns to the step S2 if the decision result of the step S6 is NO. Accordingly, the steps S2 through S6 are carried out unit i becomes equal to M (M denotes the size of the collection buffer). The process ends when the decision result in the step S6 becomes YES.

(3) Mask Process And Data Defined Process:

The mask buffer 31 has the same construction and the same storage capacity as the double guard buffer 30. Mask data indicating supervision points which are to be masked, that is, excluded from the supervision, and unwanted bits of the I/O memory 10, are written in the mask buffer 31. Out of the mask data, the bit corresponding to the supervision point which is to be excluded from the supervision (supervision point to be masked) is set to "0", and the bit corresponding to the supervision point which is to be supervised (supervision point not to be masked) is set to "1" The mask data within the mask buffer 31 is updated for every predetermined time by an external operation.

The AND circuit 33 obtains an AND of the data within the double guard buffer 30 and the data within the mask buffer 32, and the result of this AND operation is alternately written into the defined buffers 40 and 41 which form a buffer having two sides A and B. By this AND operation of the AND circuit 33, it is possible to mask unwanted data bits within the double guard buffer 30, that is, the data bits related to supervision points which do not need to be supervised, and unwanted bits in the I/O memory 10. The defined present pointer 42 manages the destination where the result of the AND operation is to be supplied, and alternately switches the input of the defined buffers 40 and 41. In this embodiment, the input of the defined buffers 40 and 41 is switched for every 0.5 second. The above described mask can also be used to prevent secondary faults.

(4) Transition Point Detection Process:

For example, by the above described process (3), the data related to the present supervision result are set in the defined buffer 40 and the data related to the previous supervision result of 0.5 second before are set in the defined buffer 41. The EX-OR circuit 43 obtains an exclusive-OR of the corresponding data in the defined buffers 40 and 41, and writes the result of the exclusive-OR operation into the transition point buffer 50. This transition point buffer 50 has the same construction as each of the defined buffers 40 and 41. In this embodiment, if a change occurs in the data bits related to the present and previous supervision results, the datum "1" is set at the corresponding data bit position of the transition point buffer 50.

The data set in the transition point buffer 50 in the above described manner are used when carrying out a process related to the latter fault supervision. In other words, each data bit within the transition point buffer 50 is inspected in order, and if a data bit set with the datum "1" exists, a process related to the fault supervision with respect to the supervision point corresponding to this data bit is carried out. This process related to the fault supervision includes a process of notifying the fault generation/recovery at the supervision point to the maintenance person by turning ON/OFF a light emitting element or the like, notifying a host apparatus and the like.

The time required to carry out the processes (1) through (4) described above increases as the number of supervision points increases. Normally, the fault supervision function is carried out at a cycle of 1 second or 0.5 second, for example, however, if the number of supervision points becomes extremely large, there is a possibility that the time required to carry out the processes (1) through (4) exceeds 1 cycle of the fault supervision function, and in such a case, it is impossible to carry out the supervision at predetermined intervals.

Figure 4:
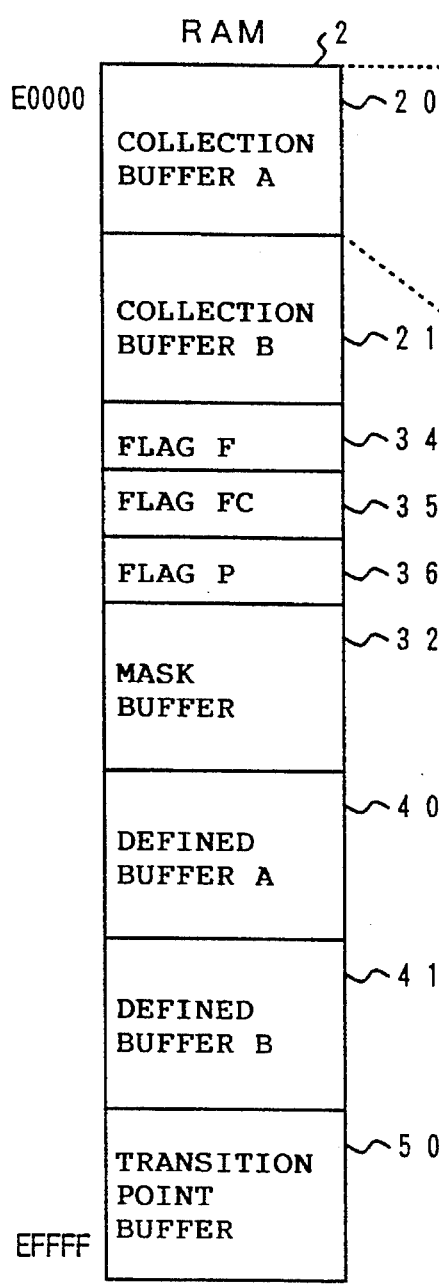
FIG. 4 is a diagram showing an example of setting a storage region of each buffer in a memory and an example of using fault supervision bits in a first embodiment of the fault supervision method for transmission apparatus according to the present invention.
Figure 5:
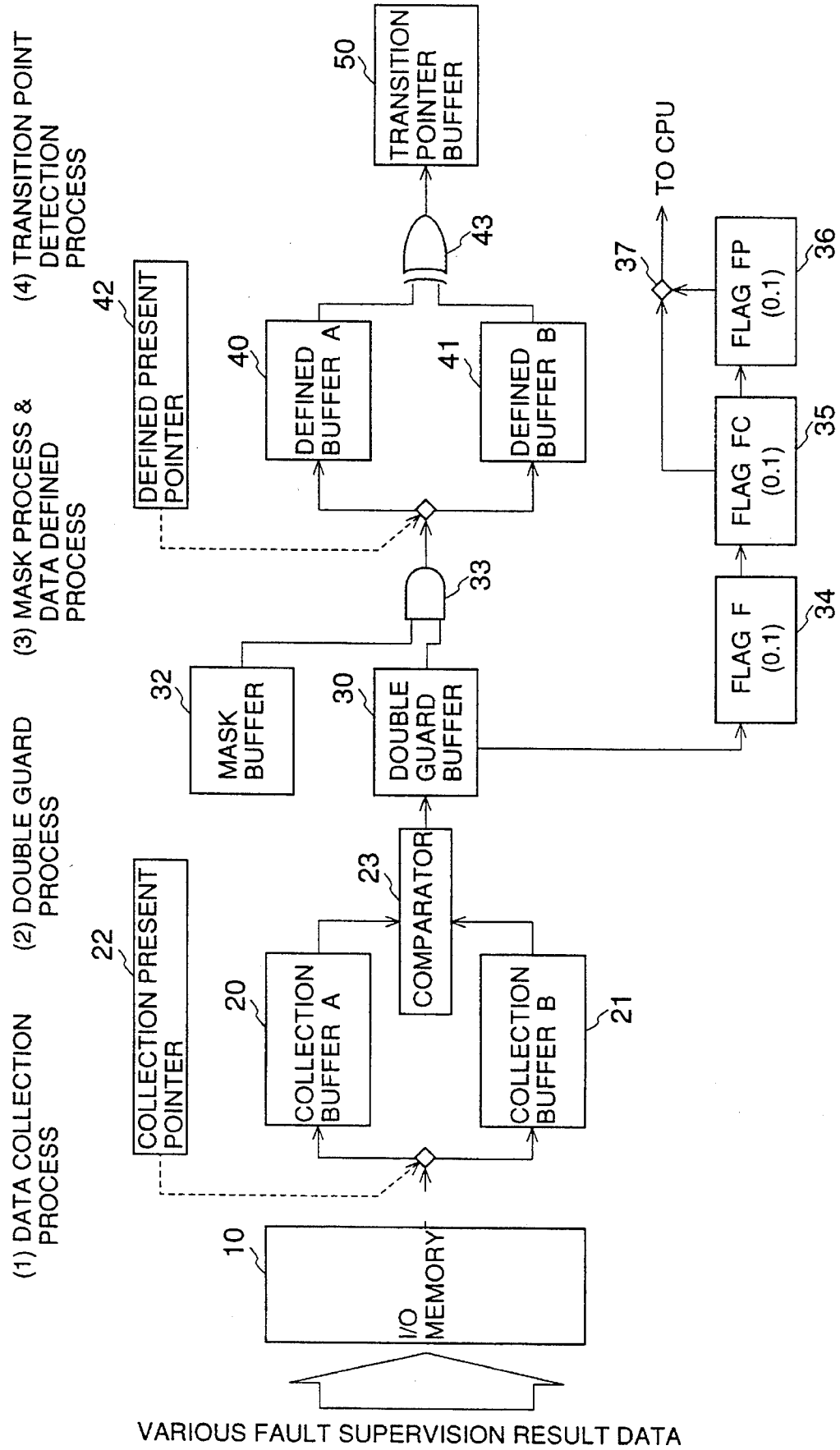
FIG. 5 is a diagram showing a data flow in the second embodiment.
Figure 6:
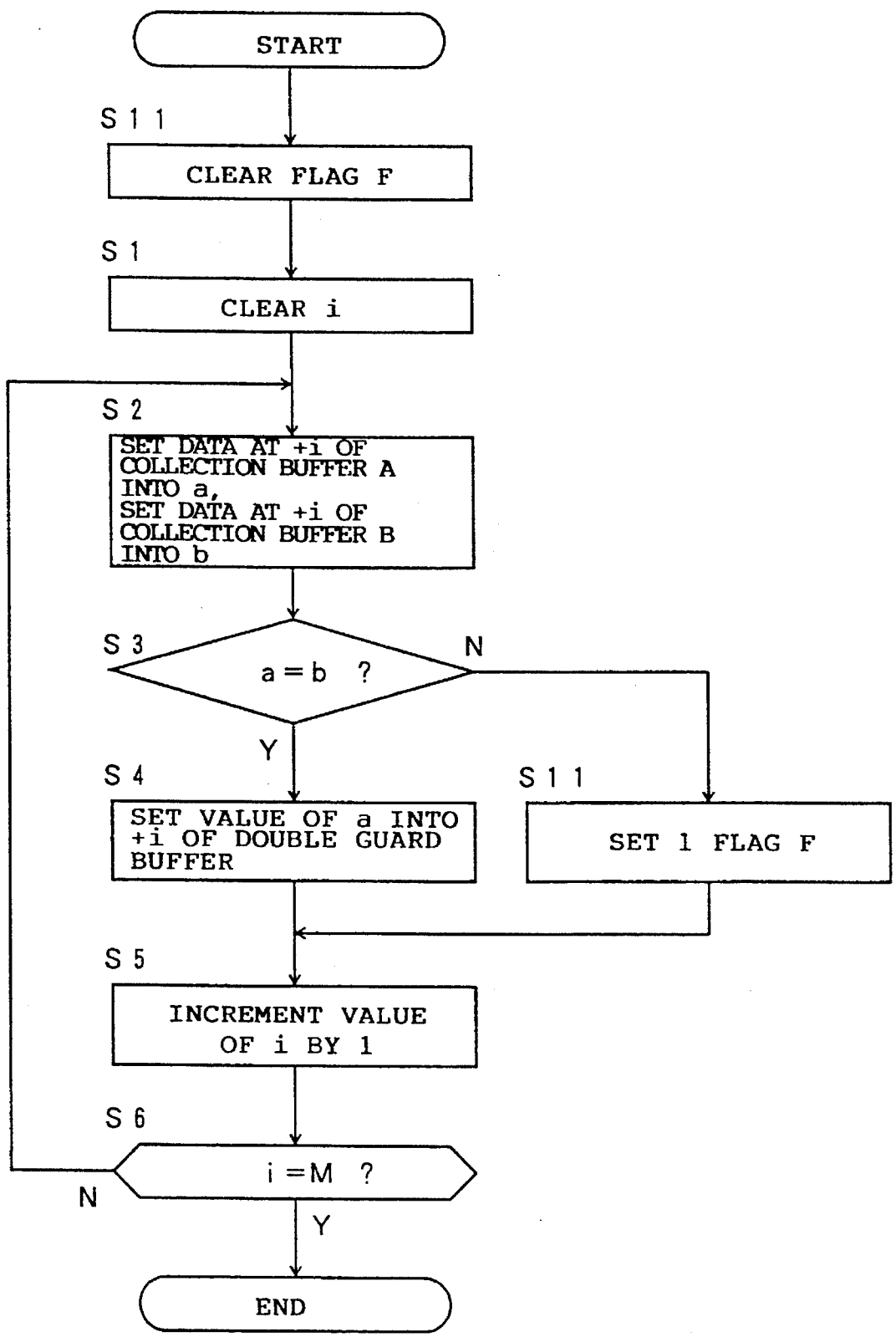
FIG. 6 is a flow chart showing a double guard process of the second embodiment.
Figure 7:
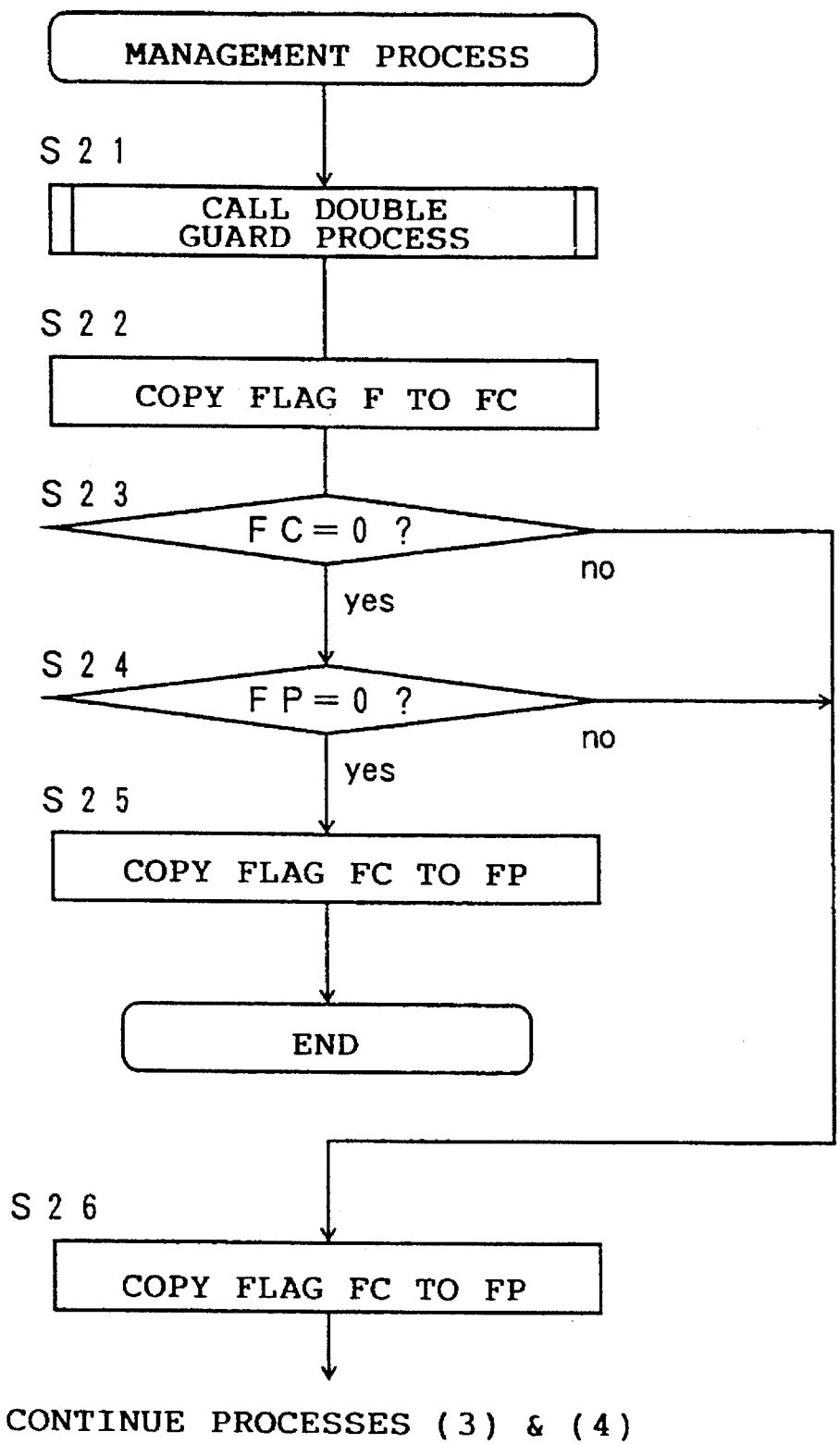
FIG. 7 is a flow chart showing a flag management process of the second embodiment.

Accordingly, a description will be given of a second embodiment of the fault supervision method for transmission apparatus according to the present invention which can eliminate the above inconvenience, by referring to FIGS. 4 through 7. FIG. 4 shows an example of setting a storage region of each buffer in a memory and an example of using fault supervision bits in the second embodiment of the fault supervision method for transmission apparatus, and FIG. 5 is a diagram showing a data flow in the second embodiment. In addition, FIG. 6 shows a double guard process in FIG. 5, and FIG. 7 shows a flag management process in FIG. 5. In FIGS. 4 and 5, those parts which are the same as those corresponding parts in FIGS. 2 and 1 are designated by the same reference numerals, and a description thereof will be omitted.

In this embodiment, flags 34, 35 and 36 for storing a flag value "1" or "0" are provided in the memory region of the RAM 2 as shown in FIG. 4. In addition, in the data flow, the flags 34 through 36 and a flag discrimination circuit 37 are newly added as shown in FIG. 5 as compared to the first embodiment shown in FIG. 1.

This embodiment carries out (1) the data collection process, (2) the double guard process, (3) the mask process and the data defined process, (4) the transition point detection process, and (5) a flag discrimination process. However, since the processes (1), (3) and (4) are the same as those of the first embodiment, a description thereof will be omitted. Hence, a description will hereunder be given of only the processes (2) and (5).

(2) Double Guard Process:

The double guard process is carried out according to the flow chart of FIG. 6. In FIG. 6, those steps which are the same as those corresponding steps in FIG. 3 are designated by the same reference numerals, and a description thereof will be omitted.

A step S11 clears the flag 34 to "0", and thereafter, the processes of the steps S1 through S6 are carried out similarly to FIG. 3. In addition, if the decision result in the step S3 is NO, a step S12 sets "1" in the flag 34 before the process advances to the step S5. Accordingly, if at least 1 bit differs as a result of the comparison of the data within the collection buffer 20 and the data within the collection buffer 21, the flag 34 is set to "1". In other words, the flag 34 stores flag information F indicating whether or not the data within the collection buffers 20 and 21 match for all bits.

(5) Flag Discrimination Process:

The flag discrimination process is carried out according to the flow chart of FIG. 7. The step S21 corresponds to the double guard process shown in FIG. 6, and processes of steps S22 through S26 carry out the flag discrimination process based on the flag information F which is obtained by the double guard process.

The step S22 copies the flag information F stored in the flag 34 to the flag 35. This flag 35 stores present flag information FC. The step S23 decides whether or not the flag information FC stored in the flag 34 is "0", and the step S24 decides whether or not previous flag information FP stored in the flag 36 is "0" if the decision result in the step S23 is YES. If the decision result in the step S24 is YES, the step S25 copies the present flag information FC stored in the flag 35 to the flag 36, and the process ends. In other words, the data within the collection buffers 20 and 21 match for all bits in this case and the supervision state does not change. Hence, the subsequent processes (3) and (4) with respect to the present data are omitted, and only the processes (1), (2) and (5) are required.

On the other hand, if the decision result in the step S23 or S24 is NO, the step S26 copies the present flag information FC stored in the flag 35 to the flag 36. In this case, at least 1 bit of the data within the collection buffers 20 and 21 does not match, and thus, the subsequent processes (3) and (4) are carried out similarly to the first embodiment.

Next, a more detailed description will be given of the case where the processes (3) and (4) may be omitted. In the following description, it is assumed for the sake of convenience that the previous data are set in the collection buffer 21 and the previous data are set in the defined buffer 41.

(A) First, in the previous double guard process, if the previous data within the collection buffer 21 and the data of two cycles before within the collection buffer 20 match for all supervision points, that is, match for all bits, the previous data within the collection buffer 21 and the data (result of previous double guard process) set within the double guard buffer 30 during the previous double guard process match for all bits. The result of this previous double guard process is set from the double guard buffer 30 to the defined buffer 41 via the AND circuit 33.

(B) Next, in the present double guard process, the present data are set in the collection buffer 20. In this state, if no change occurs in the state of the fault of the transmission apparatus, the data set within the collection buffer 20 and the previous data within the collection buffer 21 match for all bits. When the data within the collection buffer 20 and the data within the collection buffer 21 match for all bits, the present data within the collection buffer 20 and the result of the present double guard process set in the double guard buffer 30 match for all bits. This result of the present double guard process is set from the double guard buffer 30 to the defined buffer 40 via the AND circuit 33.

As may be seen from the processes (A) and (B) described above, the result of the previous double guard process and the result of the present double guard process match for all bits. In addition, since the state of the fault of the transmission apparatus at the present is not changed from the previous state, the mask data set in the mask buffer 32 also match for all bits between the present cycle and the previous cycle. For this reason, the previous data within the defined buffer 41 and the present data within the defined buffer 40 match for all bits. In other words, in this case, all of the bits of the data set in the transition point buffer 50 this time (during present cycle) become "0". Accordingly, if the results of the double guard processes match for all bits between the previous cycle and the present cycle, the bits of the present data finally set in the transition point buffer 50 all become "0", indicating that no change has occurred in the supervision result. Hence, it may be seen that the subsequent (3) the mask process and the data defined process and (4) the transition point detection process may be omitted if the results of the double guard processes match for all bits between the previous cycle and the present cycle.

In general, it is extremely rare tat the information related to the fault or the like changes, and such a change only occurs at a rate of a couple of times per month, for example. Accordingly, the effect of reducing the load on the CPU (software) by omitting the processes (3) and (4) in the second embodiment is extremely large.

Further, the present invention is not limited to these embodiments, but various variations and modifications may be made without departing from the scope of the present invention.

INDUSTRIAL APPLICABILITY

As described above, according to the fault supervision method for transmission apparatus of the present invention, it is possible to prevent detection or the like of a fault which is instantaneously generated when the unit of the transmission apparatus switched, and to greatly reduce the supervision process time by carrying out the flag discrimination process in a normal state where the change of the fault generation/recovery does not occur, thereby making the present invention extremely useful from the practical point of view. Particularly when the flag discrimination process is carried out, it is possible to shorten the supervision interval, quicken the fault detection timing, and positively carry out the required process within 1 cycle of the fault supervision function even when the number of supervision points (supervision items) increase, thereby improving the service of the fault supervision system of the transmission apparatus.

The invention claimed is:

1. A fault supervision method for a transmission apparatus, notifying a change in a fault/recovery state based on fault supervision result data indicating a plurality of fault supervision items to be supervised, set in a memory of the transmission apparatus, said fault supervision method comprising the steps of:

(a) alternately setting the fault supervision result data at an arbitrary point in time and the fault supervision result data at a next point in time from the memory into a first collection buffer and a second collection buffer;

(b) setting present fault supervision result data into a double guard buffer only when the previous and present fault supervision result data set in the first and second collection buffers match for all fault supervision items of said plurality of fault supervision items; and (c) setting data indicating the fault supervision items for which the fault/recovery state changed into a transition point buffer based on the data set in the double guard buffer.

2. The fault supervision method for a transmission apparatus as claimed in claim 1, which further comprises the step of:

(d) masking an arbitrary fault supervision item out of the fault supervision result data set in the double guard buffer.

3. The fault supervision method for a transmission apparatus as claimed in claim 2, wherein said step (c) alternately sets the data at the arbitrary point in time and the data at the next point in time which are masked by said step (d) into a first defined buffer and a second defined buffer, and sets in the transition point buffer an exclusive-OR of the previous and present data set in the first and second defined buffers (40, 41) which is obtained for each of the fault supervision items.

4. The fault supervision method for a transmission apparatus as claimed in claim 1, wherein the previous fault supervision result data are maintained in the double guard buffer (30) when the previous and present fault supervision result data set in tile first and second collection buffers (20, 21) differ for at least one supervision item.

5. The fault supervision method for a transmission apparatus as claimed in claim 1, which further comprises the step of:

(d) notifying a change in the fault/recovery state based on the data set in the transition point buffer (50).

6. The fault supervision method for a transmission apparatus as claimed in claim 1, which further comprises the step of:

(d) setting a flag (F) when the previous and present fault supervision result data set in the first and second collection buffers (20, 21) differ for at least one supervision item and otherwise clearing the flag (F), and carrying out said step (c) only when the flag (F) is set for two successive points in time.

7. The fault supervision method for a transmission apparatus as claimed in claim 1, which further comprises the step of:

(d) setting a flag (F) when the previous and present fault supervision result data set in the first and second collection buffers (20, 21) differ for at least one supervision item and otherwise clearing the flag (F), and omitting at least said step (c) when the flag (F) is cleared for two successive points in time.

8. The fault supervision method for a transmission apparatus as claimed in claim 7, which further comprises the step of:

(e) masking an arbitrary fault supervision item out of the fault supervision result data set in the double guard buffer.

9. The fault supervision method for a transmission apparatus as claimed in claim 8, wherein said step (c) alternately sets the data at the arbitrary point in time masked by said step (e) and the data at the next point in time into a first defined buffer and a second defined buffer, and sets in the transition point buffer an exclusive-OR of the previous and present data set in the first and second defined buffers which is obtained for each of the fault supervision items.

10. The fault supervision method for a transmission apparatus as claimed in claim 8, wherein said step (d) also omits said step (e) when the flag (F) is cleared for two successive points in time.

11. The fault supervision method for a transmission apparatus as claimed in claim 7, wherein the previous fault supervision result data are maintained in the double guard buffer when the previous and present fault supervision result data set in the first and second collection buffers differ for at least one fault supervision item.

12. The fault supervision method for a transmission apparatus as claimed in claim 7, which further comprises the step of:

(e) notifying a change in the fault/recovery state based on the data set in the transition point buffer.

* * * * *